(12) United States Patent
Degani et al.

(10) Patent No.: US 8,175,366 B2
(45) Date of Patent: May 8, 2012

(54) METHOD FOR OBTAINING SPATIAL IMAGES THROUGH MRI AND PROCESSING THE RESULTING SPATIAL IMAGES AND PRODUCT

(75) Inventors: Hadassa Degani, Rehovot (IL); Erez Eyal, Nes-ziona (IL)

(73) Assignee: Yeda Research & Development Co. Ltd., Rehovot (IL)

( * ) Notice: Subject to any disclaimer, the term of this patent is extended or adjusted under 35 U.S.C. 154(b) by 515 days.

(21) Appl. No.: 12/443,943

(22) PCT Filed: Oct. 17, 2007

(86) PCT No.: PCT/US2007/081580
§ 371 (c)(1),
(2), (4) Date: Apr. 1, 2009

(87) PCT Pub. No.: WO2008/048982
PCT Pub. Date: Apr. 24, 2008

(65) Prior Publication Data
US 2010/0092058 A1    Apr. 15, 2010

Related U.S. Application Data

(60) Provisional application No. 60/829,705, filed on Oct. 17, 2006.

(51) Int. Cl.
*G06K 9/00* (2006.01)
(52) U.S. Cl. .................................................. 382/131
(58) Field of Classification Search .................. 382/131
See application file for complete search history.

(56) References Cited

U.S. PATENT DOCUMENTS

| | | | |
|---|---|---|---|
| 6,157,192 A | 12/2000 | Cordes | |
| 6,353,803 B1 * | 3/2002 | Degani | 702/100 |
| 6,553,327 B2 | 4/2003 | Degani | |
| 6,681,132 B1 * | 1/2004 | Katz et al. | 600/410 |
| 6,909,914 B2 | 6/2005 | Pedrizzetti et al. | |
| 6,961,455 B2 * | 11/2005 | Ma et al. | 382/131 |
| 7,228,246 B2 * | 6/2007 | Degani | 702/100 |
| 7,599,542 B2 * | 10/2009 | Brockway et al. | 382/132 |
| 7,974,676 B2 * | 7/2011 | Penn et al. | 600/407 |
| 2006/0072821 A1 | 4/2006 | Wang | |

OTHER PUBLICATIONS

Written Opinion published Apr. 17, 2009 for PCT/US2007/081580 filed Oct. 17, 2007.
International Preliminary Report on Patentability published Apr. 22, 2009 for PCT/US2007/081580 filed Oct. 17, 2007.
International Search Report published Apr. 24, 2008 for PCT/US2007/081580, filed Oct. 17, 2007.

* cited by examiner

*Primary Examiner* — Rodney Fuller
(74) *Attorney, Agent, or Firm* — Martin Fleit; Paul D. Bianco; Fleit Gibbons Gutman Bongini & Bianco PL

(57) ABSTRACT

A method for recording a set of MRI images of a tissue pixel by pixel that evolve with time in a specific manner described by a function; processing the recorded MRI images by aggregating the pixels thereof according to a preselected aspect of time behavior; best fitting the aggregated pixels to a predetermined pixel function to obtain the parameters of the function; and presenting the parameters visually. A computer readable medium containing executable program instructions for carrying out the method.

16 Claims, 6 Drawing Sheets

$v_e$, pixel by pixel $v_e$, after aggregation $K$, pixel by pixel $K$, after aggregation     min$^{-1}$ $R^2$, goodness of fit of pixel by pixel $R^2$, goodness of fit after aggregation

METHOD FOR OBTAINING SPATIAL IMAGES THROUGH MRI AND PROCESSING THE RESULTING SPATIAL IMAGES AND PRODUCT

BACKGROUND OF THE INVENTION

The present invention relates to a method for obtaining spatial images through magnetic resonance imaging and processing the resultant spatial images and a product resulting from the application of the method, and more particularly a method for diagnosing cancer through MRI and aggregating the resulting MRI images according to a novel and specialized algorithm and a product comprised of computer readable recorded programs for carrying out the method.

PRIOR ART

The art is always looking for improvements to existing technology in order to obtain better and more precise results. This is true with respect to the field of magnetic resonance imaging, known as MRI, particularly regarding the detection of cancer in human tissue.

SUMMARY OF THE INVENTION

Accordingly, the present invention has for its principal object an improved method for obtaining and processing of spatial images through magnetic resonance imaging whereby the obtained images provide an improvement in order to obtain better detection of cancer in human tissue, and to a computer readable medium containing programs for carrying out the method.

The manner by which the present invention achieves the foregoing is accomplished by a novel processing of the spatial images obtained by magnetic resonance of human tissue. In more detail, the new processing technique includes a novel algorithm that aggregates similar dynamic behavior in a set of spatial images.

The invention is accomplished by a method comprising the steps of recording a set of MRI images of a tissue pixel by pixel that evolve with time in a specific manner described by a function; processing the recorded MRI images by aggregating the pixels thereof according to a preselected aspect of time behavior; best fitting the aggregated pixels to a predetermined pixel function to obtain the parameters of the function; and presenting the parameters visually. By visually presented is meant that the parameters are displayed by being sent immediately to a monitor, are printed immediately by being sent to a printer, or are stored in memory by being sent to a store or memory for future display or printing.

The function is intensity of the pixels; the function is $$I_{SE}(TR)=I(0)[1-\exp(-TR/T_1)]$$

where $I_{SE}$ is the intensity in a pixel for a certain TR, $I(0)$ is a free parameter reaching the intensity for TR=infinity, and $T_1$, the second free parameter, is the longitudinal relaxation time of the water in a pixel.

The inventive method can take the form of a method comprising the steps of injecting a contrast agent into a patient; recording a set of time-spaced MRI pixel-by-pixel images of a preselected area of tissue of the patient using a gradient echo sequence; performing aggregation based on pixel intensity on the recorded images; best-fitting the aggregated intensities to a preselected intensity function to yield maps of specific parameters of the tissue; and presenting the maps visually.

The specific parameters are transcapillary transfer constant and extravascular extracellular volume fraction. The intensity function is expressed as $$[I(t)-I(0)]/I(0)=[1-\exp(-TR/T_{10})\cos\alpha](1-\exp\{-TR[1/T_{10}R_1C_1(t))]\}/\{1-\exp[-TR(1/T_{10}+R_1C_1(t))]\cos\alpha\}[1-\exp(-TR/T_{10})]-1$$

where $I(t)$ is intensity at time t after administration of the contrast agent, $I(0)$ is intensity pre-contrast, TR is the repetition time of the sequence, $\alpha$ is the flip angle of the pulse, $T_{10}$ is the longitudinal relaxation time pre-contrast, $R_1$ is the relaxivity of the contrast agent, namely, the change in the relaxation of water when the concentration of the contrast agent increases by 1 millimolar, and $C_t(t)$ is the concentration of the contrast agent which is given by $$Ct(t)=D[b_1\exp(-m_1t)+b_2\exp(-m_2t)+b_3\exp(-Kt/v_e)],$$

$b_1=Ka_1/(K/v_e-m_1)$; $b_2=Ka_2/(K/v_e-m_2)$; and $b_3=-(b_1+b_2)$ where D is the contrast agent dose (known), $a_1, m_1$ and $a_2, m_2$, are the corresponding amplitude and decay constants of the contrast agent in the body plasma which can be determined independently, and K and $v_e$ are the transcapillary transfer constant and the extravascular extracellular volume fraction, respectively.

The invention can also be a method comprising the steps of: a. creating a dataset by reading a set of N images of size n*n that specify x, y location; b. converting the dataset into a 3D matrix of n*n*N where N is the number of discrete samples of a function (creating a vector); c. determining the similarities for the vector of each pixel with x,y coordinates in the images to the vectors of each one of its 4 surrounding pixels according to a predefined norm; d. finding the most similar vector in the surrounding neighbors for each pixel x,y in the image; e. averaging the two similar vectors or employing another mathematical manipulation; f. creating a new n*n*N matrix that includes the similar vectors; g. repeating steps d, e and f q times and stopping according to convergence criterion; h. performing an automatic fitting process, for each pixel x,y, using the final vectors to find the function parameters; and i. presenting the parameters visually.

The above method can include the further step of mapping the function parameters; and displaying the mapped function parameters.

The invention may also be a method comprising the steps of: a. creating a dataset by reading N images of size n*n*m that specify x,y,z location; b. converting the dataset into a 4D matrix of n*n*m*N where N is the number of discrete samples of a function creating a vector; c. determining for the vector of each pixel with x,y,z coordinates in the images similarities to the vectors of each one of its 6 surrounding pixels according to a predefined norm; d. finding for each pixel x,y,z in the image the most similar vector in the surrounding neighbors; e. averaging the two similar vectors or employ another mathematical manipulation; f. creating a new n*n*m*N matrix with that include the similar vectors; g. repeating steps c, d, e and f q times and stopping according to convergence criterion; h. performing an automatic fitting process, for each pixel x,y,z using the final vectors to find the function parameters; and i. presenting visually the function parameters.

The foregoing method can include the step of mapping the function parameters.

The invention further contemplates a computer readable medium containing executable program instructions for recording a set of MRI images of a tissue pixel by pixel that evolve with time in a specific manner described by a function; processing the recorded MRI images by aggregating the pixels thereof according to a preselected aspect of time behavior; and best fitting the aggregated pixels to a predetermined pixel function to obtain the parameters of the function; and presenting the parameters visually. The function is intensity of the pixels.

Further, the function is $$I_{SE}(TR)=I(0)[1-\exp(-TR/T_1)]$$

where $I_{SE}$ is the intensity in a pixel for a certain TR, I(0) a free parameter reaching the intensity for TR=infinity, and $T_1$, the second free parameter, is the longitudinal relaxation time of the water in a pixel.

The invention further contemplates a computer readable medium containing executable program instructions for recording a set of time-spaced MRI pixel-by-pixel images of a preselected area of tissue of a patient injected with a contrast agent using a gradient echo sequence; performing aggregation based on pixel intensity on the recorded images; best-fitting the aggregated intensities to a preselected intensity function to yield maps of specific parameters of the tissue; and presenting the maps visually. The specific parameters are transcapillary transfer constant and extravascular extracellular volume fraction.

The intensity function is expressed as $$[I(t)-I(0)]/I(0)=[1-\exp(-TR/T_{10})\cos\alpha](1-\exp\{-TR[1/T_{10}+R_1C_t(t)]\}/\{1-\exp[-TR(1/T_{10}+R_1C_t(t))]\cos\alpha\}[1-\exp(-TR/T_{10})]-1.$$

where I(t) is intensity at time t after administration of the contrast agent, I(0) is intensity pre-contrast, TR is the repetition time of the sequence, $\alpha$ is the flip angle of the pulse, $T_{10}$ is the longitudinal relaxation time pre-contrast, $R_1$ is the relaxivity of the contrast agent, namely, the change in the relaxation of water when the concentration of the contrast agent increases by 1 millimolar, and $C_t(t)$ is the concentration of the contrast agent which is given by $$Ct(t)=D[b_1\exp(-m_1 t)+b_2\exp(-m_2 t)+b_3\exp(-Kt/v_e),$$

$b_1=Ka_1/(K/v_e-m_1)$; $b_2=Ka_2/(K/v_e-m_2)$; and $b_3=-(b_1+b_2)$ where D is the contrast agent dose (known), $a_1, m_1$ and $a_2, m_2$, are the corresponding amplitude and decay constants of the contrast agent in the body plasma which can be determined independently, and K and $v_e$ are the transcapillary transfer constant and the extravascular extracellular volume fraction, respectively.

The invention further contemplates a computer readable medium containing executable program instructions for a. creating a dataset by reading a set of N images of size n*n that specify x, y location; b. converting the dataset into a 3D matrix of n*n*N where N is the number of discrete samples of a function (creating a vector); c. determining the similarities for the vector of each pixel with x,y coordinates in the images to the vectors of each one of its 4 surrounding pixels according to a predefined norm; d. finding the most similar vector in the surrounding neighbors for each pixel x,y in the image; e. averaging the two similar vectors or employing another mathematical manipulation; f. creating a new n*n*N matrix that includes the similar vectors; g. repeating steps d, e and f q times and stopping according to convergence criterion; and h. performing an automatic fitting process, for each pixel x,y, using the final vectors to find the function parameters. The instructions can include mapping the function parameters.

A still further invention contemplated is a computer readable medium containing executable program instructions for a. creating a dataset by reading N images of size n*n*m that specify x, y, z location; b. converting the dataset into a 4D matrix of n*n*m*N where N is the number of discrete samples of a function creating a vector; c. determining for the vector of each pixel with x,y,z coordinates in the images similarities to the vectors of each one of its 6 surrounding pixels according to a predefined norm; d. finding for each pixel x,y,z in the image the most similar vector in the surrounding neighbors; e. averaging the two similar vectors or employ another mathematical manipulation; f. creating a new n*n*m*N matrix with that include the similar vectors; g. repeating steps c, d, e and f q times and stopping according to convergence criterion; and h. performing an automatic fitting process, for each pixel x,y,z using the final vectors to find the function parameters. This medium can include instructions for mapping the function parameters.

Further objects and advantages of the present invention will become apparent from the following detailed description of preferred embodiments of the invention when taken in conjunction with the appended drawings.

BRIEF DESCRIPTION OF THE DRAWINGS

FIG. 1a shows the map ($T_1$, pixel by pixel) before aggregation and FIG. 1b shows the map ($T_1$, aggregation method) after aggregation. $T_1$ is shown in ms at the right of FIGS. 1a and 1b.

FIG. 2 shows in six views, FIGS. 2A to 2F, the fitting of dynamic contrast enhanced magnetic resonance images to Equation (2) (after incorporating Eq. (3)) using a known non-linear least square fitting program. The three left side views.

DETAILED DESCRIPTION OF PREFERRED EMBODIMENTS OF THE INVENTION

The novel processing can be applied to both 2D and 3D images obtained by MRI of animal and human tissue. The algorithm, forming the basis of the new method, is applied to either 2D or 3D images that evolve with time in a specific manner, and are described by a function. The principal purpose of the novel method is to aggregate similar time behavior. By practice of the method of the present invention, one obtains an increased ability for a better fitting to the function that describes the temporal behavior. The invention has advantages in cases where the signal intensity-to-noise ratio of the images is low. By practice of the invention, it is possible to average the intensity of nearby pixels, which has the effect of increasing the signal-to-noise ratio and improving the fitting. However, averaging intensity may reduce the spatial resolution, depending on how many pixels were averaged. Alternatively, it is possible to find all the pixels in an image or within a region of interest in an image that demonstrate a similar time dependency, "aggregate" them and obtain their average time dependency and then, further fit to the function. This alternative retains the original spatial resolution but gains in signal to noise ratio.

The present invention will be described in detail in the following. The practicality of the method of the invention will be demonstrated by showing how the novel algorithm is used in processing T1 measurements of a rat uterus and in dynamic contrast enhanced studies of breast cancer.

In the first example of the present invention, the uterine tissue of a rat was imaged with a spin echo sequence having the same echo time (TE) and with increasing repetition times (TR). The function (of interest) describing the intensity in each pixel of the images as a function of the repetition time is given by equation (1) as follows:

$$I_{SE}(TR)=I(0)[1-\exp(-TR/T_1)] \quad (1)$$

where $I_{SE}$ is the intensity in a pixel for a certain TR, I(0) is a free parameter reaching the intensity for TR=infinity, and $T_1$, the second free parameter, is the longitudinal relaxation time of the water in a pixel.

A set of MRI images with varying repetition times, TR, is first recorded or stored in electronic form, and, then, the images are electronically processed by the method of the invention, by performing on them an aggregation process with n iterations. The final step of the method is to fit the resultant intensities to the function expressed in equation (1), with the results as shown in FIG. 1.

Figure 1A:
FIGS. 1a and 1b show T1 maps of a rat abdomen including the bladder, uterus and thigh muscle.
Figure 1B:
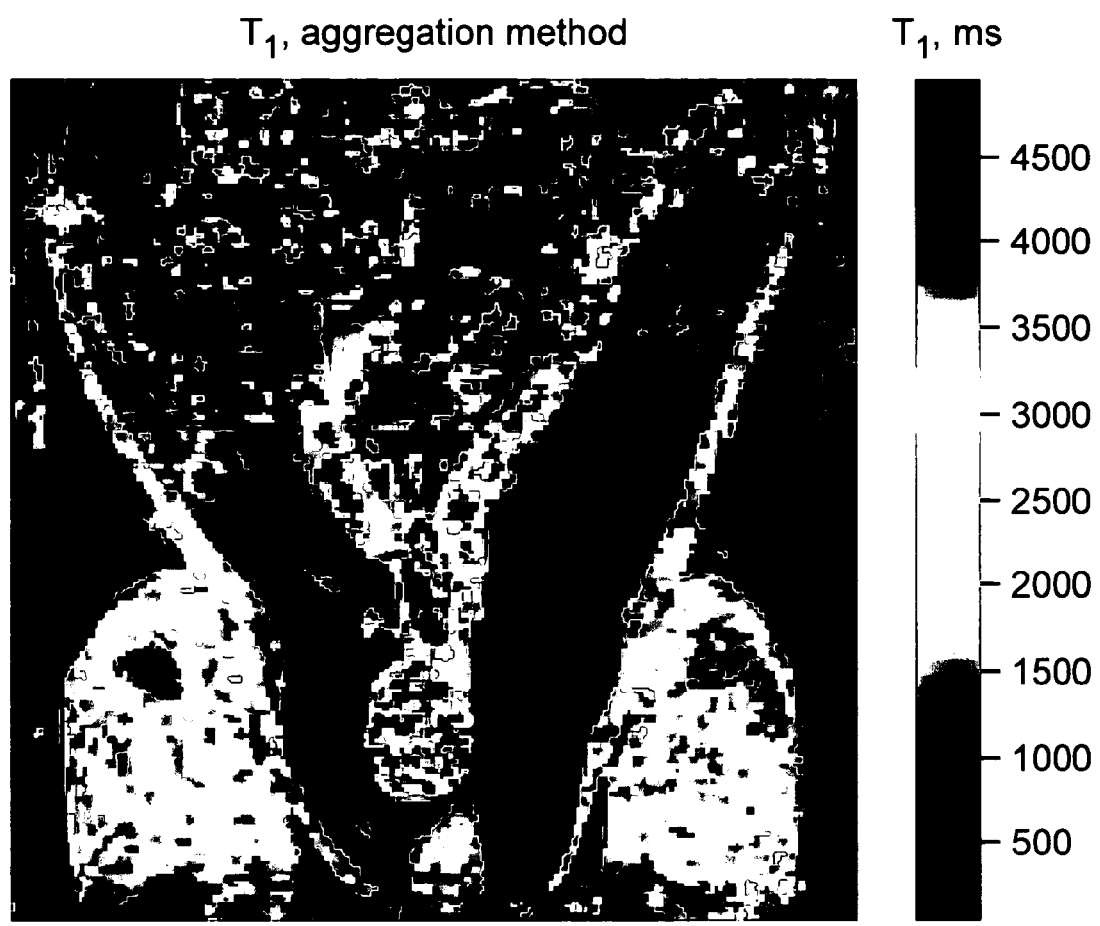
Figure 2A:
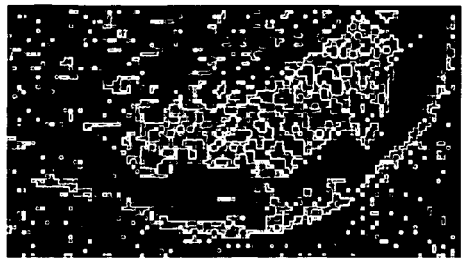
FIGS. 2A, 2C and 2E, show the image mapped pixel by pixel, $v_e$, pixel by pixel; K, pixel by pixel; and $R^2$, goodness of fit of pixel by pixel, respectively. The three right side views.
Figure 2B:
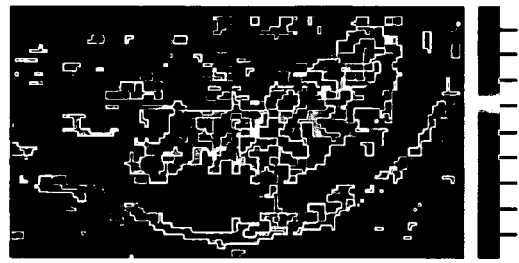
FIGS. 2B, 2D and 2F show the images mapped after aggregation, $v_e$ after aggregation; K, after aggregation; and $R^2$, goodness of fit after aggregation, respectively. The color chart for $min^{-1}$ is shown to the right of the pairs of views.
Figure 2C:
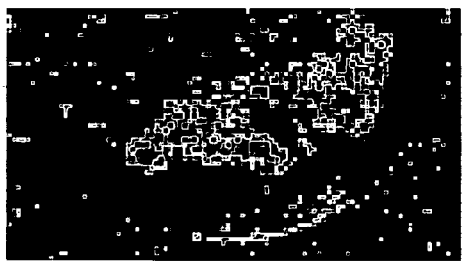
Figure 2D:
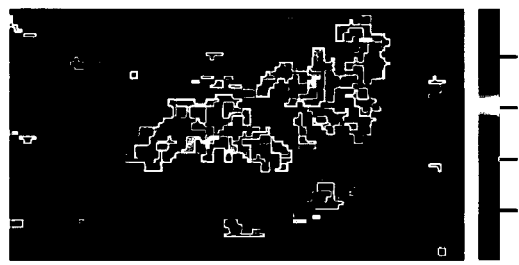
Figure 2E:
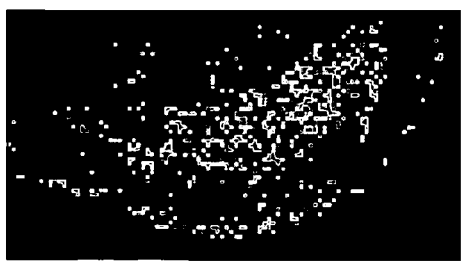
Figure 2F:
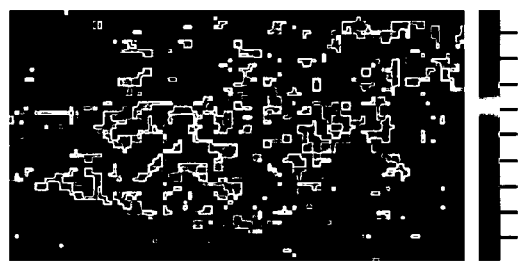

FIGS. 1a and 1b show T1 maps of a rat abdomen including the bladder, uterus and thigh muscle. FIG. 1a shows the map ($T_1$, pixel by pixel) before aggregation and FIG. 1b shows the map ($T_1$, aggregation method) after aggregation. $T_1$ is shown in ms at the right of FIGS. 1a and 1b.

In the second example, the breasts of patients with cancer were imaged by MRI before and several times after injecting a contrast agent using a gradient echo sequence. The signal enhancement per pixel that evolved in time (neglecting the contribution of $T_2$) is given by equation (2) as follows:

$$[I(t)-I(0)]/I(0)=[1-\exp(-TR/T_{10})\cos\alpha](1-\exp\{-TR$$
$$[1/T_{10}+R_1C_t(t))]\}/\{1-\exp[-TR(1/T_{10}+R_1C_t(t))]$$
$$\cos\alpha\}[1-\exp(-TR/T_{10})]-1 \quad (2)$$

where I (t) is intensity at time t after administration of the contrast agent, I(0) is intensity pre-contrast, TR is the repetition time of the sequence, $\alpha$ is the flip angle of the pulse, $T_{10}$ is the longitudinal relaxation time pre-contrast, $R_1$ is the relaxivity of the contrast agent, namely, the change in the relaxation of water when the concentration of the contrast agent increases by 1 millimolar, and $C_t(t)$ is the concentration of the contrast agent which is given by equation (3) as follows:

$$Ct(t)=D[b_1\exp(-m_1t)+b_2\exp(-m_2t)+b_3\exp(-Kt/v_e), \quad (3)$$

$b_1=Ka_1/(K/v_e-m_1)$; $b_2=Ka_2/(K/v_e-m_2)$; and $b_3=-(b_1+b_2)$ where D is the contrast agent dose (known), $a_1$, $m_1$ and $a_2$, $m_2$, are the corresponding amplitude and decay constants of the contrast agent in the body plasma which can be determined independently, and K and $v_e$ are the transcapillary transfer constant and the extravascular extracellular volume fraction respectively.

By incorporating Eq. (3) into Eq. (2), and fitting the enhancement using a known non-linear best fit algorithm, the incorporation yields the two parameters K and $v_e$. In the example described, a set of pre- and post-contrast enhanced MRI images were recorded and stored electronically at various times. Then, the method of the invention continued with the steps of performed an aggregation process with n iterations on the stored and recorded images. The resultant aggregated intensities were then fitted to equation (2) to yield maps of K and $v_e$, the specific parameters of the cancer.

FIG. 2 shows in six views, 2A to 2F, the fitting of the dynamic contrast enhanced magnetic resonance images to Equation (2) (after incorporating Eq. (3)) using a known non-linear least square fitting program. The three left side views, 2A, 2C and 2E, show the image mapped pixel by pixel, $v_e$, pixel by pixel; K, pixel by pixel; and $R^2$, goodness of fit of pixel by pixel, respectively. The three right side views, 2B, 2D and 2F show the images mapped after aggregation, $v_{el}$ after aggregation; K, after aggregation; and $R^2$, goodness of fit after aggregation, respectively. The color chart for min$^{-1}$ is shown to the right of the pairs of views. Note the dramatic increase in the goodness of the fitting ($R^2$) after aggregation, and also, the "smoothing" of the maps. The purpose of the novel algorithm is to improve post processing fitting of 2D or 3D spatial data evolving with time (3D or 4D analysis) by applying an aggregation process using the time dependence as the criterion for aggregation.

The input for the method of processing is a set of N images each of size n*n or n*n*m. For each x,y or x,y,z location in the N images there is a vector of discrete samples of some function. The output of the method of processing is a set of N images of size n*n or n*n*m after the aggregation process. The programs (flow charts) for a 2D n*n image size and N time points and a 3D n*n*m image with N time points are shown in FIG. 3 and FIG. 4, respectively.

Figure 3:
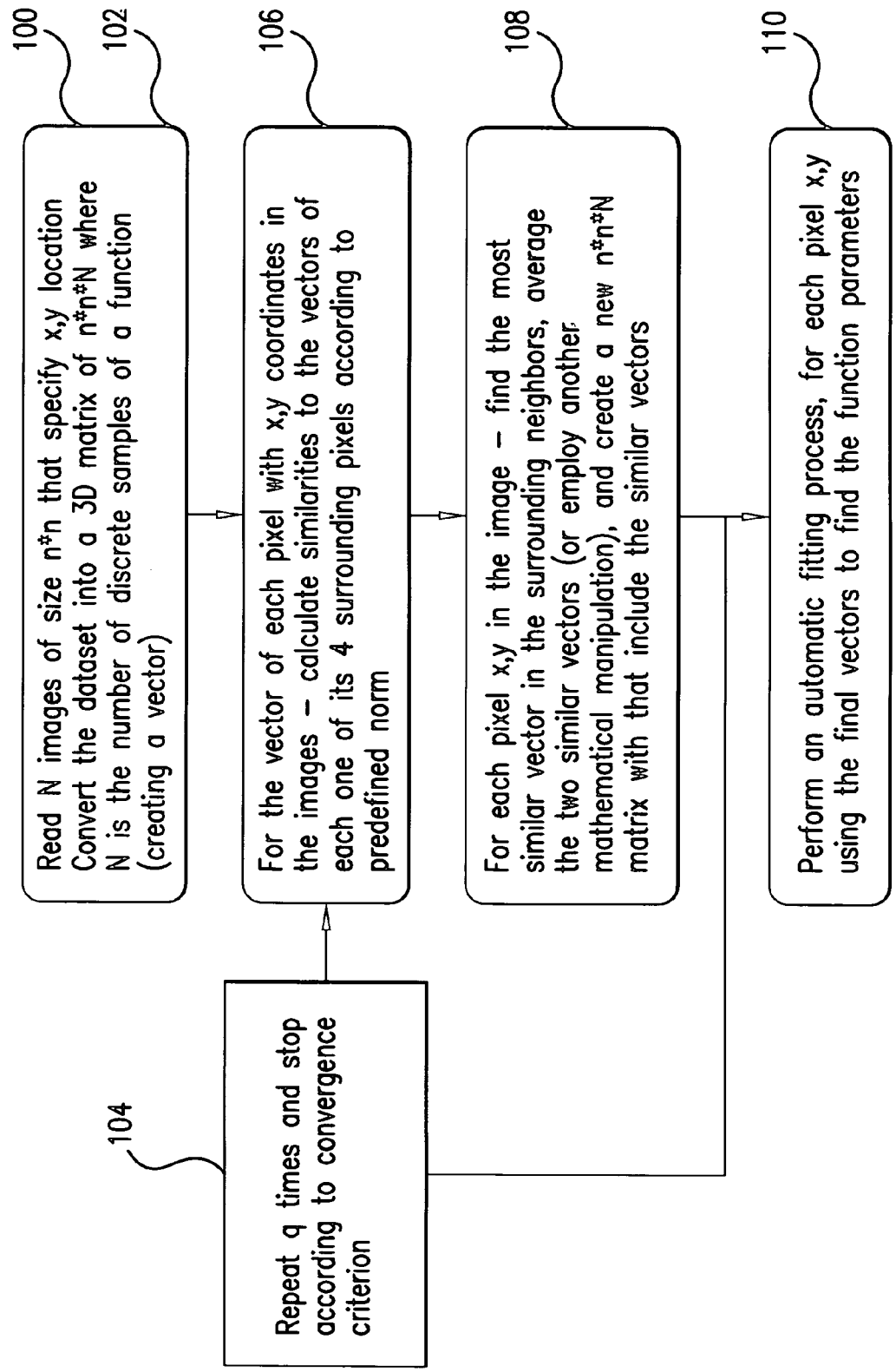
FIG. 3 and FIG. 4, respectively, show the programs (flow charts) for a 2D n*n image size and N time points and a 3D n*n*m image with N time points.

For a 2D n*n image size and N time points, see FIG. 3, the first step 100 is to read N images of size n*n that specify x, y location. The next step 102 is to convert the dataset into a 3D matrix of n*n*N where N is the number of discrete samples of a function (creating a vector). The next step 106 is to calculate—for the vector of each pixel with x,y coordinates in the images—similarities to the vectors of each one of its 4 surrounding pixels according to predefined norm. Then, for each pixel x,y in the image, the next step 108 is to find the most similar vector in the surrounding neighbors, then, average the two similar vectors (or employ another mathematical manipulation), and then to create a new n*n*N matrix and with that include the similar vectors. Then the step 104 is carried out by repeating q times and stopping according to convergence criterion. The next step 110 performs an automatic fitting process, for each pixel x,y, and then the step of using the final vectors to find the function parameters. Finally maps are displayed or printed out or saved to memory.

Figure 4:
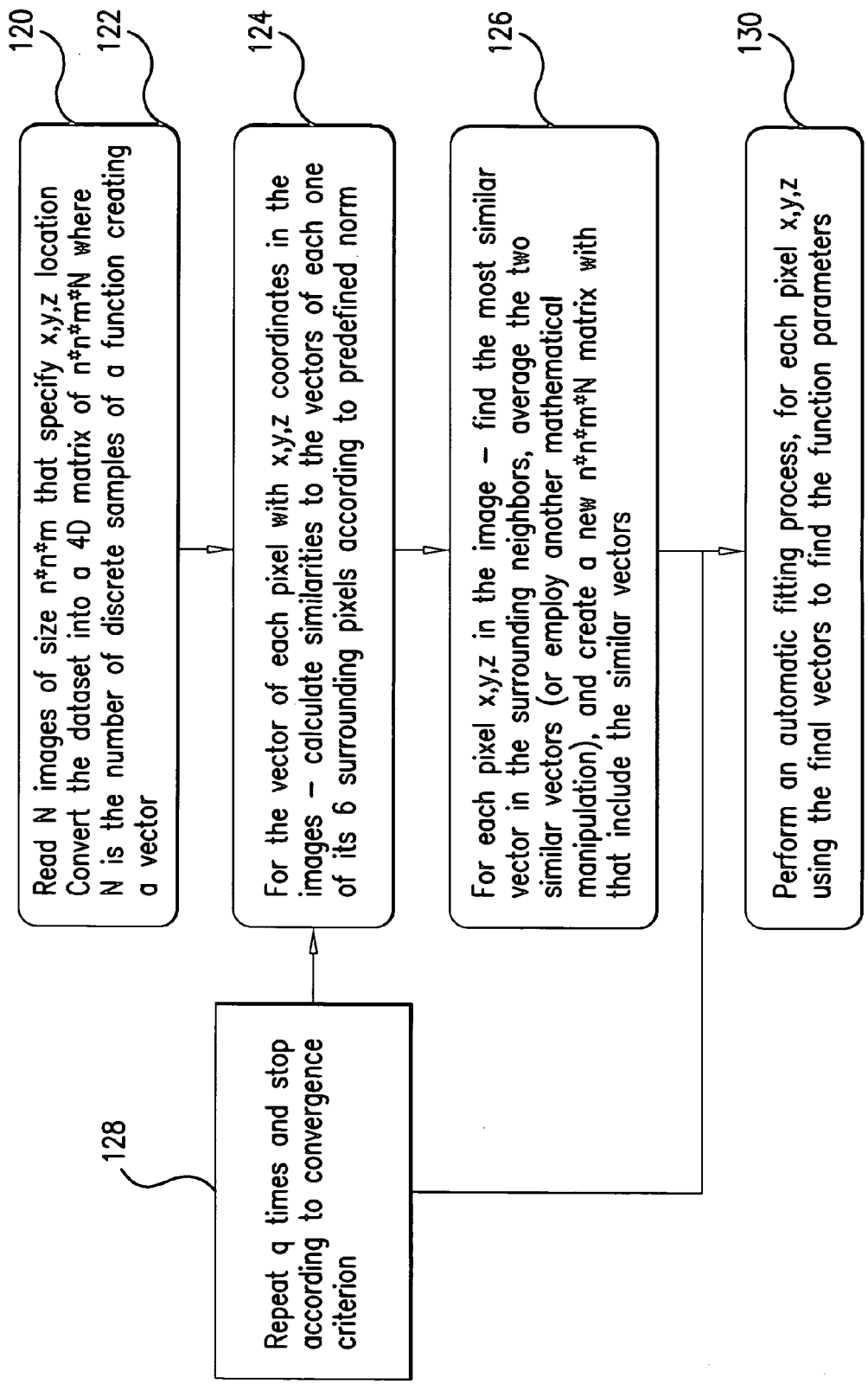

For a 3D n*n*m image with N time points, see FIG. 4, the first step 120 is to read N images of size n*n*m that specify x, y, z location. The next step 122 is to convert the dataset into a 4D matrix of n*n*m*N where N is the number of discrete samples of a function creating a vector. Then the step 124 of calculating—for the vector of each pixel with x,y,z coordinates in the images—similarities to the vectors of each one of its 6 surrounding pixels according to predefined norm. The next step 126 is to find—for each pixel x,y,z in the image—the most similar vector in the surrounding neighbors, then carry out the step of averaging the two similar vectors (or employ another mathematical manipulation), and then the step of creating a new n*n*m*N matrix and with that include the similar vectors. The next step 128 is to repeat q times and stop according to convergence criterion. The next step 130 performs an automatic fitting process, for each pixel x,y,z and the step of using the final vectors to find the function parameters. Finally maps are displayed or printed out or saved to memory.

The present invention can be realized in hardware, software, or a combination of hardware and software. A method and system according to a preferred embodiment of the present invention can be realized in a centralized fashion with an MRI machine connected to one computer system, or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

An embodiment of the present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network that allow a computer system to read such computer readable information.

Figure 5:
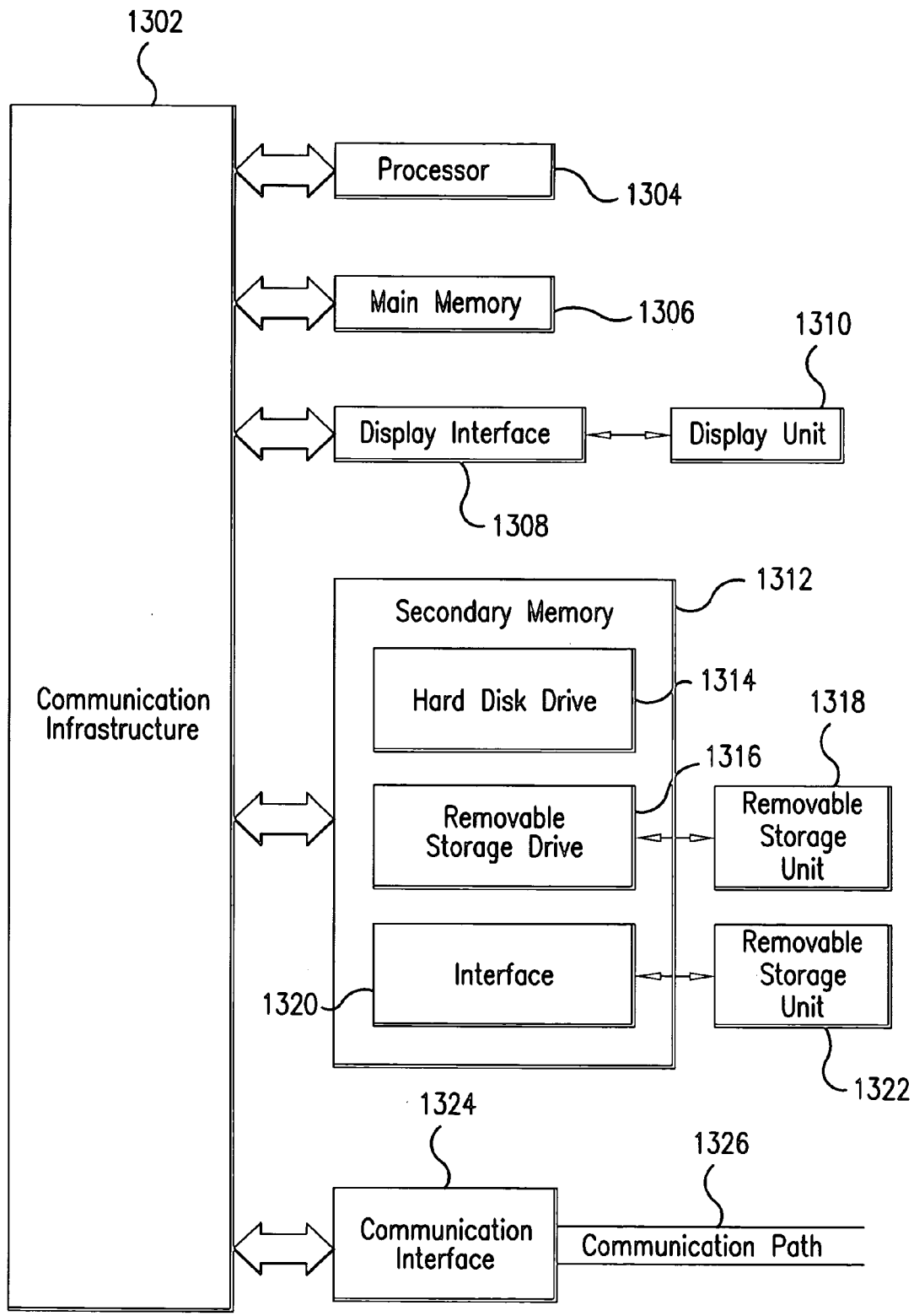
FIG. 5 is a block diagram of a computer system useful for implementing an embodiment of the present invention.

FIG. 5 is a block diagram of a computer system useful for implementing an embodiment of the present invention. The computer system includes one or more processors, such as processor 1304. The processor 1304 is connected to a communication infrastructure 1302 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system can include a display interface 1308 that forwards graphics, text, and other data from the communication infrastructure 1302 (or from a frame buffer not shown) for display on the display unit 1310, or alternatively the data can be printed out on a printer or saved to memory. The computer system also includes a main memory 1306, preferably random access memory (RAM), and may also include a secondary memory 1312. The secondary memory 1312 may include, for example, a hard disk drive 1314 and/or a removable storage drive 1316, representing a floppy disk drive, a magnetic tape drive, an optical disk drive, and more. The removable storage drive 1316 reads from and/or writes to a removable storage unit 1318 in a manner well known to those having ordinary skill in the art. Removable storage unit 1318 represents a floppy disk, magnetic tape, optical disk, and more which is read by and written to by removable storage drive 1316. As will be appreciated, the removable storage unit 1318 includes a computer usable storage medium having stored therein computer software and/or data.

In alternative embodiments, the secondary memory 1312 may include other similar means for allowing computer programs or other instructions to be loaded into the computer system. Such means may include, for example, a removable storage unit 1322 and an interface 1320. Examples of such may include a program cartridge and cartridge interface (such as that found in video game devices), a removable memory chip (such as an EPROM, or PROM) and associated socket, and other removable storage units 1322 and interfaces 1320 which allow software and data to be transferred from the removable storage unit 1322 to the computer system. The computer system may also include a communications interface 1324. Communications interface 1324 allows software and data to be transferred between the computer system and external devices. Examples of communications interface 1324 may include a modem, a network interface (such as an Ethernet card), a communications port, a PCMCIA slot and card, and more Software and data transferred via communications interface 1324 are in the form of signals which may be, for example, electronic, electromagnetic, optical, or other signals capable of being received by communications interface 1324. These signals are provided to communications interface 1324 via a communications path (i.e., channel) 1326. This channel 1326 carries signals and may be implemented using wire or cable, fiber optics, a phone line, a cellular phone link, an RF link, and/or other communications channels.

In this document, the terms "computer program medium," "computer usable medium," and "computer readable medium" are used to generally refer to media such as main memory 1306 and secondary memory 1312, removable storage drive 1316, a hard disk installed in hard disk drive 1314, and signals. These computer program products are means for providing software to the computer system. The computer readable medium allows the computer system to read data, instructions, messages or message packets, and other computer readable information from the computer readable medium. The computer readable medium, for example, may include non-volatile memory, such as Floppy, ROM, Flash memory, Disk drive memory, CD-ROM, and other permanent storage. It is useful, for example, for transporting information, such as data and computer instructions, between computer systems. Furthermore, the computer readable medium may comprise computer readable information in a transitory state medium such as a network link and/or a network interface, including a wired network or a wireless network that allow a computer to read such computer readable information.

Computer programs (also called computer control logic) are stored in main memory 1306 and/or secondary memory 1312. Computer programs may also be received via communications interface 1324. Such computer programs, when executed, enable the computer system to perform the features of the present invention as discussed herein. In particular, the computer programs, when executed, enable the processor 1304 to perform the features of the computer system. Accordingly, such computer programs represent controllers of the computer system.

Although the method and computer readable medium have been described in terms of specific preferred embodiments, nevertheless changes and modifications are possible without departing from the teachings herein. Such changes and modifications as will be readily evident to those skilled in the art are deemed to fall within the purview of the appended claims.

What is claimed is:
1. Method comprising the steps of:
   a. setting parameters of data collection for tissue in a region of interest in an animal or human suitable to be processed by a magnetic resonance imaging (MRI) apparatus operatively associated with a processor and memory;
   b. obtaining via the magnetic resonance imaging apparatus and recording in memory a dataset of N MRI images of a tissue in the region of interest of size n*n that specify x, y location pixel by pixel that evolve according to a preselected aspect of time behavior;
c. converting the dataset via the processor into a 3D matrix of n*n*N where N is the number of discrete samples of a function that creates a vector for each matrix location;
d. determining via the processor the similarities for the vector of each matrix location to the vectors of each one of its surrounding matrix locations according to a predefined norm;
e. processing the 3D matrices by aggregating matrix locations of similar vectors according to a preselected aspect of time behavior;
f. creating a new n*n*N matrix that includes the aggregated matrix locations of similar vectors;
g. repeating steps d, e and f q times and stopping according to convergence criterion;
h. best fitting the aggregated matrix locations according to a predetermined function using the final vectors to find the function parameters; and
i. presenting the parameters visually.

2. The method of claim 1 wherein the function is $$I_{SE}(TR)=I(0)[1-\exp(-TR/T_1)]$$

where $I_{SE}$ is the intensity in a pixel for a certain TR, I(0) is a free parameter reaching the intensity for TR=infinity, and $T_1$, the second free parameter, is the longitudinal relaxation time of the water in a pixel.

3. The method according to claim 1 wherein a contrast agent is injected into the tissue of a human patient.

4. The method of claim 3 wherein the specific parameters are transcapillary transfer constant and extravascular extracellular volume fraction.

5. The method of claim 3 wherein the intensity function is $$[I(t)-I(0)]/I(0)=[1-\exp(-TR/T_{10})\cos\alpha](1-\exp\{-TR[1/T_{10}+R_1 C_t(t))]\}/\{1-\exp[-TR(1/T_{10}+R_1 C_t(t))]\cos\alpha\}[1-\exp(-TR/T_{10})]-1$$

where I(t) is intensity at time t after administration of the contrast agent, I(0) is intensity pre-contrast, TR is the repetition time of the sequence, $\alpha$ is the flip angle of the pulse, $T_{10}$ is the longitudinal relaxation time pre-contrast, $R_1$ is the relaxivity of the contrast agent, namely, the change in the relaxation of water when the concentration of the contrast agent increases by 1 millimolar, and $C_t(t)$ is the concentration of the contrast agent which is given by $$Ct(t)=D[b_1\exp(-m_1 t)+b_2\exp(-m_2 t)+b_3\exp(-Kt/v_e),$$
$$b_1=Ka_1/(K/v_e-m_1); b_2=Ka_2/(K/v_e-m_2); \text{ and } b_3=-(b_1+b_2)$$

where D is the contrast agent dose (known), $a_1$, $m_1$ and $a_2$, $m_2$, are the corresponding amplitude and decay constants of the contrast agent in the body plasma which can be determined independently, and K and $v_e$ are the transcapillary transfer constant and the extravascular extracellular volume fraction, respectively.

6. The method according to claim 1 including the further step of mapping the function parameters; and displaying the mapped function parameters.

7. A method comprising the steps of:
a. setting parameters of data collection for tissue in a region of interest in an animal or human suitable to be processed by a magnetic resonance imaging (MRI) apparatus operatively associated with a processor and memory;
b. obtaining and recording in memory a dataset of N MRI images of the tissue in the region of interest of size n*n*m that specify x, y, z location;
c. converting the dataset into a 4D matrix of n*n*m*N where N is the number of discrete samples of a function creating a vector;
d. determining for the vector of each pixel with x,y,z coordinates at each matrix location in the images similarities to the vectors of each one of its 6 surrounding pixels according to a predefined norm;
e. finding for each pixel x,y,z in the image the most similar vector in the surrounding neighbors;
f. averaging the two similar vectors;
g. creating a new n*n*m*N matrix that includes the averaged similar vectors in a single matrix location;
h. repeating steps c, d, e and f q times and stopping according to convergence criterion;
i. performing an automatic fitting process, for each pixel x,y,z using the final vectors of each matrix location to find the function parameters; and
j. presenting visually the function parameters.

8. Method according to claim 7 including the step of mapping the function parameters.

9. A computer system operatively associated with a magnetic resonance imaging (MRI) apparatus wherein the system comprises a processor, a memory and a non-transitory computer readable storage medium storing readable instructions wherein execution of the instructions causes the processor to
a. set parameters of data collection for tissue in a region of interest in an animal or human suitable to be processed by the operatively associated magnetic resonance imaging (MRI) apparatus;
b. obtain and record in memory a dataset of N MRI images of a tissue in the region of interest of size n*n that specify x, y location pixel by pixel that evolve according to a preselected aspect of time behavior;
c. convert the dataset into a 3D matrix of n*n*N where N is the number of discrete samples of a function that creates a vector for each matrix location;
d. determine the similarities for the vector of each matrix location to the vectors of each one of its surrounding matrix locations according to a predefined norm;
e. process the 3D matrices by aggregating matrix locations of similar vectors;
f. create a new n*n*N matrix that includes the aggregated matrix locations of similar vectors;
g. repeat steps d, e and f q times and stop according to convergence criterion;
h. best fit the aggregated matrix locations according to a predetermined function using the final vectors to find the function; and
i. present the parameters visually.

10. The computer system of claim 9 wherein the function is $$I_{SE}(TR)=I(0)[1-\exp(-TR/T_1)]$$

where $I_{SE}$ is the intensity in a pixel for a certain TR, I(0) is a free parameter reaching the intensity for TR=infinity, and $T_1$, the second free parameter, is the longitudinal relaxation time of the water in a pixel.

11. The computer system of claim 9 wherein the instructions include controlling injection of a contrast agent into the tissue of a human patient.

12. The computer system of claim 9 wherein the specific parameters are transcapillary transfer constant and extravascular extracellular volume fraction.

13. The computer system of claim 12 wherein the intensity function is $$[I(t)-I(0)]/I(0)=[1-\exp(-TR/T_{10})\cos\alpha](1-\exp\{-TR[1/T_{10}+R_1 C_t(t))]\}/\{1-\exp[-TR(1/T_{10}+R_1 C_t(t))]\cos\alpha\}[1-\exp(-TR/T_{10})]-1$$

where I(t) is intensity at time t after administration of the contrast agent, I(0) is intensity pre-contrast, TR is the repetition time of the sequence, $\alpha$ is the flip angle of the pulse, $T_{10}$ is the longitudinal relaxation time pre-contrast, $R_1$ is the relaxivity of the contrast agent, namely, the change in the relaxation of water when the concentration of the contrast agent increases by 1 millimolar, and $C_t(t)$ is the concentration of the contrast agent which is given by $$Ct(t)=D[b_1\exp(-m_1 t)+b_2\exp(-m_2 t)+b_3\exp(-Kt/v_e),$$
$$b_1=Ka_1/(K/v_e-m_1); b_2=Ka_2/(K/v_e-m_2); \text{ and } b_3=-(b_1+b_2)$$

where D is the contrast agent dose (known), $a_1$, $m_1$ and $a_2$, $m_2$, are the corresponding amplitude and decay constants of the contrast agent in the body plasma which can be determined independently, and K and $v_e$ are the transcapillary transfer constant and the extravascular extracellular volume fraction, respectively.

14. The computer system of claim 13 wherein the instructions further include the further steps of mapping the function parameters; and displaying the mapped function parameters.

15. A computer system operatively associated with a magnetic resonance imaging (MRI) apparatus wherein the system comprises a processor, a memory and a non-transitory computer readable storage medium storing readable instructions wherein execution of the instructions causes the processor to:
  a. set parameters of data collection for tissue in a region of interest in an animal or human suitable to be processed by a magnetic resonance imaging (MRI) apparatus operatively associated with a processor and memory;
  b. obtain and record in memory a dataset of N MRI images of the tissue in the region of interest of size n*n*m that specify x, y, z location;
  c. convert the dataset into a 4D matrix of n*n*m*N where N is the number of discrete samples of a function creating a vector;
  d. determine for the vector of each pixel with x,y,z coordinates at each matrix location in the images similarities to the vectors of each one of its 6 surrounding matrix locations according to a predefined norm;
  e. find for each pixel x,y,z in the image the most similar vector in the surrounding matrix locations;
  f. average the two similar vectors;
  g. create a new n*n*m*N matrix that includes the averaged similar vectors in a single matrix location;
  h. repeat steps c, d, e and f q times and stopping according to convergence criterion;
  i. perform an automatic fitting process, for each pixel x,y,z using the final vectors of each matrix location to find the function parameters; and
  j. presenting visually the function parameters.

16. The computer system according to claim 15 wherein the instructions further include the step of mapping the function parameters.

* * * * *